US008334528B2

(12) United States Patent
Kuzumoto et al.

(10) Patent No.: US 8,334,528 B2
(45) Date of Patent: Dec. 18, 2012

(54) ORGANIC THIN-FILM TRANSISTOR AND METHOD FOR MANUFACTURING THE SAME

(75) Inventors: Yasutaka Kuzumoto, Osaka (JP);
Shigeru Aomori, Osaka (JP); Masatoshi Kitamura, Tokyo (JP); Yasuhiko Arakawa, Tokyo (JP)

(73) Assignees: Sharp Kabushiki Kaisha, Osaka (JP);
The University of Tokyo, Tokyo (JP)

( * ) Notice: Subject to any disclaimer, the term of this patent is extended or adjusted under 35 U.S.C. 154(b) by 217 days.

(21) Appl. No.: 12/683,360

(22) Filed: Jan. 6, 2010

(65) Prior Publication Data
US 2010/0176387 A1   Jul. 15, 2010

(30) Foreign Application Priority Data

Jan. 9, 2009  (JP) .................................. 2009-003943

(51) Int. Cl.
*H01L 29/08* (2006.01)
*H01L 35/24* (2006.01)
*H01L 51/00* (2006.01)

(52) U.S. Cl. .......................................... 257/40; 438/99
(58) Field of Classification Search ................. 257/40; 438/99
See application file for complete search history.

(56) References Cited

U.S. PATENT DOCUMENTS

| 7,750,341 B2 * | 7/2010 | Yang et al. ................. 257/40 |
| 2006/0255335 A1 * | 11/2006 | Nishikawa et al. ............. 257/40 |

FOREIGN PATENT DOCUMENTS

| JP | 2004-288836 A | 10/2004 |
| JP | 2005-223107 A | 8/2005 |
| JP | 2007-80848 A | 3/2007 |
| JP | 2007-150156 A | 6/2007 |
| JP | 2008-140883 A | 6/2008 |

OTHER PUBLICATIONS

Kobayashi et al., "Control of carrier density by self-assembled monolayers in organic field-effect transistors ", Nature Materials, vol. 3, May 2004, pp. 317-322.

* cited by examiner

*Primary Examiner* — Kimberly Rizkallah
*Assistant Examiner* — Errol Fernandes
(74) *Attorney, Agent, or Firm* — Birch, Stewart, Kolasch & Birch, LLP

(57) ABSTRACT

An organic thin-film transistor of the present invention has a gate electrode, a gate insulating film, a source electrode, a drain electrode, and an organic semiconductor layer provided above a substrate, and further has a thiol compound layer composed of a benzenethiol compound and provided on a surface of the source electrode and a thiol compound layer composed of a benzenethiol compound and provided on a surface of the drain electrode. This makes it possible to provide an organic thin-film transistor whose threshold voltage can be selectively controlled without greatly affecting a current characteristic other than the threshold voltage.

9 Claims, 7 Drawing Sheets

ORGANIC THIN-FILM TRANSISTOR AND METHOD FOR MANUFACTURING THE SAME

This Nonprovisional application claims priority under 35 U.S.C. §119(a) on Patent Application No. 2009-003943 filed in Japan on Jan. 9, 2009, the entire contents of which are hereby incorporated by reference.

TECHNICAL FIELD

The present invention relates to organic thin-film transistors having semiconductor portions made with organic materials and methods for manufacturing the same and, in particular, to an organic thin-film transistor whose threshold voltage can be selectively controlled and a method for manufacturing the same.

BACKGROUND ART

In recent years, the so-called organic thin-film transistors, in which semiconductors composed of organic materials are used, have been attracting attention over inorganic semiconductors such as silicon.

In recent years, there have been reports on examples of organic thin-film transistors that exhibit the same mobility as amorphous silicone thin-film transistors (a-Si TFTs) do. Further, the capability to produce elements at a low processing temperature of not more than 200° C. has made it possible to form transistor elements on lowly heat-resistant plastic substrates and the like. Thus, studies have been conducted on techniques for realizing flexible devices with use of the flexibility of plastic substrates.

Further, the organic materials allow production of devices through print processes and the like, depending on types of material. As such, the organic materials are expected to serve as semiconductor elements that allow a reduction in manufacturing cost and manufacture of large-area devices by printing.

In terms of putting transistors to practical use, it is important to control current-voltage characteristics. Above all, in terms of operating transistors within a desired voltage range, it is extremely important to control a threshold voltage characteristic.

For example, Non-Patent Literature 1 discloses a method for controlling a threshold voltage characteristic by forming an organic silane compound layer between a gate insulating film surface and an organic semiconductor layer.

Further, Patent Literature 1 discloses a method for controlling the threshold voltage by forming silane compound layers between a source electrode and an organic semiconductor layer, between a drain electrode and the organic semiconductor layer, and between a gate insulating film and the organic semiconductor layer, respectively.

Patent Literature 1 also discloses forming layers of an fluoroalkylthiol compound (F17C10-Thiol) between the source electrode and the organic semiconductor layer and between the drain electrode and the organic semiconductor layer (on the source and drain electrodes), respectively.

CITATION LIST

Patent Literature 1
Japanese Patent Application Publication, Tokukai, No. 2007-80848 A (Publication Date: Mar. 29, 2007)
Non-Patent Literature 1
Nature Materials, May 2004, Vol. 3. pp. 317-322

SUMMARY OF INVENTION

Technical Problem

However, the conventional configurations have such a problem that the threshold voltage cannot be selectively controlled.

Specifically, for example, CMOS circuits of silicon devices must be of appropriate uniform value in threshold voltage. For this reason, it is important to control the threshold voltage with an organic device. It is also necessary to individually control the threshold voltage and a current characteristic other than the threshold voltage. Therefore, it is extremely important to selectively control the threshold voltage.

However, the method of Non-Patent Literature 1 controls the threshold voltage by forming the organic silane compound layer on the gate insulating film. For this reason, control of the threshold voltage undesirably affects mobility.

An organic thin-film transistor has a channel, generated in an organic semiconductor layer just proximal to a gate insulating film surface, which gives passage to carriers. However, carriers supposed to pass through the channel are caught by a trap present on the gate insulating film surface. This results in a reduction in mobility.

In Non-Patent Literature 1, the density of carriers in the channel is controlled by selecting an organic silane compound molecule that is formed on the gate insulating film surface, whereby the threshold voltage varies. However, the state of the gate insulating film surface affects mobility for the following reason.

Specifically, formation of an organic silane compound layer on a gate insulating film surface as in Non-Patent Literature 1 causes a change in number of traps. The term "trap" here means a carrier-catching site that is present on the interface between the gate insulating film surface and the organic silane compound layer. More specifically, the term "trap" means a site where a hole and an electron are trapped by partially negatively-charged oxygen and partially positively-charged hydrogen, respectively, in a hydroxyl group (—OH) emanating from the gate insulating film surface.

Formation of an organic silane compound layer on a gate insulating film surface as in Non-Patent Literature 1 causes an organic silane compound molecule and —OH on the gate insulating film surface to bind together to form an —O—Si— bond. This makes it possible to destroy an electron trap. Further, a hole trap and an organic semiconductor layer can be placed at a distance corresponding to the thickness of the organic silane compound layer. This makes it possible to reduce the number of hole traps that are present on the interface between the gate insulating film surface and the organic silane compound layer. This results in a change in mobility.

Thus, in Non-Patent Literature 1, the organic silane compound layer formed on the gate insulating film affects not only control of the threshold voltage but also mobility, which is a current characteristic other than the threshold voltage. This makes it impossible to selectively control the threshold voltage.

Meanwhile, the method of Patent Literature 1 controls the threshold voltage by forming the silane compound layers on the source electrode, on the drain electrode, and on the gate insulating film, respectively. For example, it is possible to control the threshold voltage by controlling the density of a silane compound from which each silane compound layer is formed.

Meanwhile, Patent Literature 1 teaches that the silane compound layers adsorbed on the source and drain electrodes and the silane compound layer formed between the gate insulating film and the organic semiconductor film may be formed from different silane compounds. However, with the configuration of Patent Literature 1, the silane compound layers have no choice but to be identical. This makes it difficult to selectively control the threshold voltage.

Specifically, as mentioned above, the silane compound on the gate insulating film affects the threshold voltage and mobility, which is a current characteristic other than the threshold voltage. For this reason, in Patent Literature 1, it is necessary to differentiate the silane compounds on the source and drain electrodes from the silane compound on the gate insulating film with no change in the silane compound on the gate insulating film, in order to selectively control the threshold voltage (i.e., to independently control the threshold voltage and the state of the gate insulating film surface).

However, Patent Literature 1 teaches no method by which the silane compound layers adsorbed on the source and drain electrodes and the silane compound layer formed between the gate insulating film and the organic semiconductor film are formed from different silane compounds. Moreover, it is realistically difficult in the configuration of Patent Literature 1 to form the silane compound layers from different silane compounds. Furthermore, Patent Literature 1 provides only examples where identical silane compounds were used. This leaves no choice but to form the silane compound layers on the source and drain electrodes and the silane compound layer on the gate insulating film from identical silane compounds. Therefore, the configuration of Patent Literature 1 cannot selectively control only the threshold voltage, either.

Furthermore, in Patent Literature 1, the threshold voltage cannot be controlled at all in cases where the silane compound layers are formed from an fluoroalkylthiol compound (aliphatic thiol compound).

Thus, the conventional methods cannot selectively control the threshold voltage without affecting a current characteristic other than the threshold voltage.

The present invention has been made in view of the foregoing conventional problems, and it is an object of the present invention to provide: an organic thin-film transistor whose threshold voltage can be selectively controlled without greatly affecting a current characteristic other than the threshold voltage; and a method for manufacturing the same.

Solution to Problem

The inventors of the present invention diligently studied to solve the foregoing problems and, as a result, found that the threshold voltage can be selectively controlled by providing thiol compound layers between a source electrode and an organic semiconductor layer and between a drain electrode and the organic semiconductor layer, respectively, the thiol compound layers being respectively composed of benzenethiol compounds each having an electron-donating group. Thus, the inventors accomplished the present invention.

In order to solve the foregoing problems, an organic thin-film transistor of the present invention is an organic thin-film transistor having a gate electrode, a gate insulating film, a source electrode, a drain electrode, and an organic semiconductor layer provided above a substrate, the organic thin-film transistor including thiol compound layers provided in such portions on the source and drain electrodes, respectively, as to make electrical contact with the organic semiconductor layer, the thiol compound layers being respectively composed of benzenethiol compounds each having an electron-donating group bonded to a benzene ring.

The foregoing configuration has the thiol compound layers provided in such portions on surfaces of the source and drain electrodes, respectively, as to make electrical contact with the organic semiconductor layer. These thiol compound layers are respectively composed of benzenethiol compounds each having an electron-donating group bonded to a benzene ring. Further, the thiol compound layers are provided on the source and drain electrodes, respectively, but are not provided on the gate insulating film.

It should be noted here that the threshold voltage is affected by the state of the gate insulating film (e.g., capacitance or density of traps in the film) and the way in which carriers are injected from the source electrode into the organic semiconductor layer. Further, as mentioned above, mobility is affected by the state of the gate insulating film surface.

The foregoing configuration, which has the thiol compound layers provided on the source and drain electrodes, respectively, makes it possible to change the way in which carriers are injected from the source electrode into the organic semiconductor layer. This makes it possible to control the threshold voltage. Further, the thiol compound layers are not provided on the gate insulating film. This makes it possible to selectively control only the threshold voltage with no change in mobility.

Furthermore, since the thiol compound layers are respectively composed of benzenethiol compounds each having an electron-donating group bonded to a benzene ring, electrical polarization is formed between the source and drain electrodes and the organic semiconductor layer. This electrical polarization leads to threshold voltage control necessary for injecting carries into the organic semiconductor layer.

Thus, the foregoing configuration makes it possible to selectively control the threshold voltage without greatly affecting a current characteristic other than the threshold voltage.

In order to solve the foregoing problems, a method according to the present invention for manufacturing an organic thin-film transistor is a method for manufacturing an organic thin-film transistor having a gate electrode, a gate insulating film, a source electrode, a drain electrode, and an organic semiconductor layer provided above a substrate, the method including the step of forming thiol compound layers in such portions on the source and drain electrodes, respectively, that the thiol compound layers make electrical contact with the organic semiconductor layer, the thiol compound layers being respectively composed of benzenethiol compounds each having an electron-donating group bonded to a benzene ring.

The foregoing method forms the thiol compound layers in such portions on surfaces of the source and drain electrodes, respectively, that the thiol compound layers make electrical contact with the organic semiconductor layer. Furthermore, these thiol compound layers are respectively composed of benzenethiol compounds each having an electron-donating group bonded to a benzene ring. Further, the thiol compound layers are provided on the source and drain electrodes, respectively, but are not provided on the gate insulating film. Therefore, the method makes it possible to manufacture an organic thin-film transistor whose threshold voltage can be selectively controlled without greatly affecting a current characteristic other than the threshold voltage.

For a fuller understanding of the nature and advantages of the invention, reference should be made to the ensuing detailed description taken in conjunction with the accompanying drawings.

DESCRIPTION OF EMBODIMENTS

An embodiment of the present invention is described below with reference to FIGS. 1 through 9.

(1) Organic Thin-film Transistor

Figure 1:
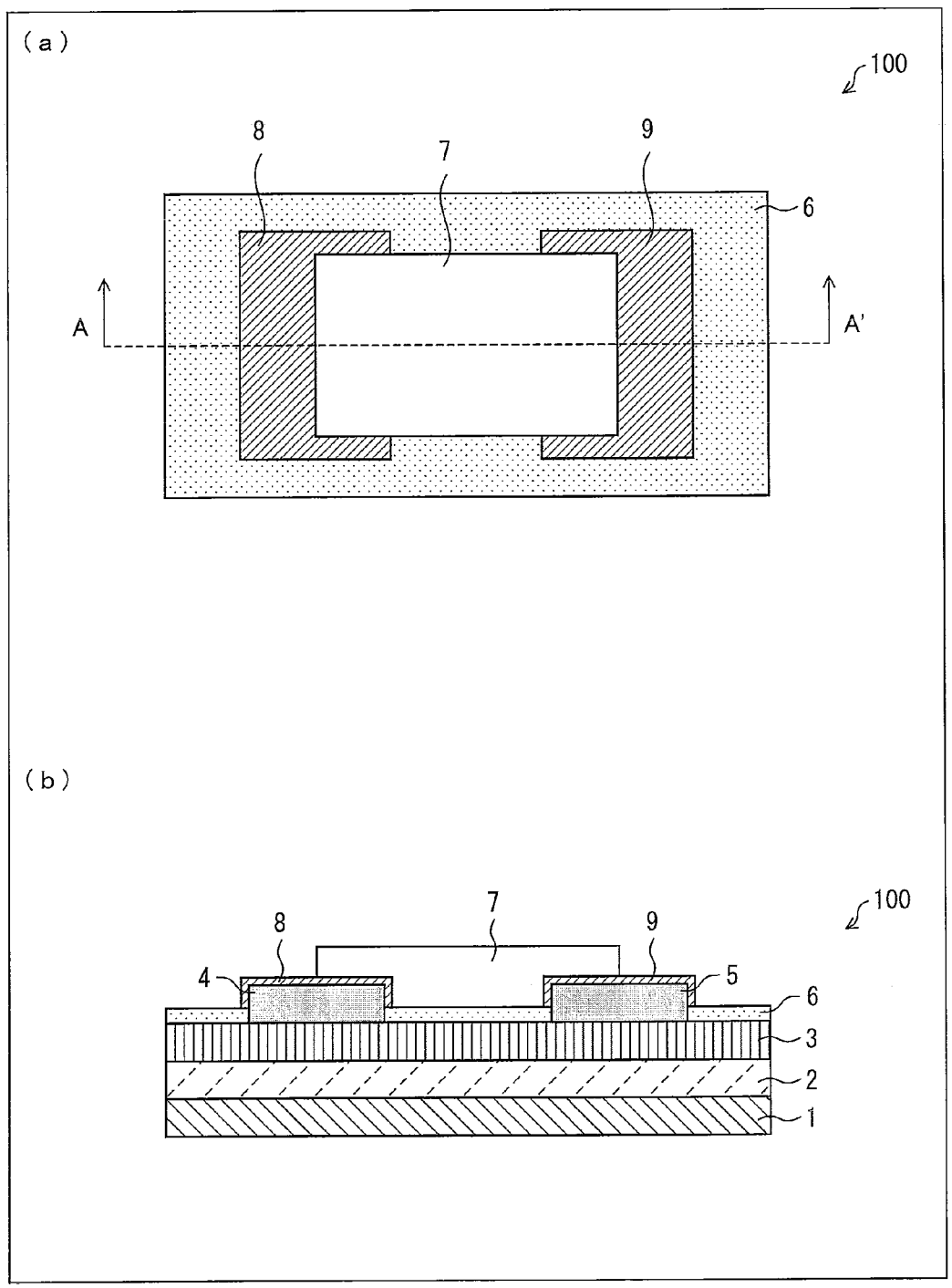
FIG. 1 shows the configuration of a relevant part of an organic thin-film transistor according to an embodiment of the present invention, (a) of FIG. 1 being a top view, (b) of FIG. 1 being a cross-sectional view taken along the line A-A' in (a) of FIG. 1.

FIG. 1 shows the configuration of a relevant part of an organic thin-film transistor 100 of the present embodiment, (a) of FIG. 1 being a top view, (b) of FIG. 1 being a cross-sectional view taken along the line A-A' in (a) of FIG. 1.

As shown in FIG. 1, the organic thin-film transistor 100 of the present embodiment includes a substrate 1, a gate electrode 2 provided on the substrate 1, and a gate insulating film 3 provided on the gate electrode 2. Provided on the gate insulating film 3 at a distance from each other are a source electrode 4 and a drain electrode 5. Provided above the gate insulating film 3 in such a way as to be interposed between the source electrode 4 and the drain electrode 5 is an organic semiconductor layer 7. Provided between the gate insulating film 3 and the organic semiconductor layer 7 is a silane compound layer 6. Provided on the source and drain electrodes 4 and 5 are a thiol compound layer 8 and a thiol compound layer 9, respectively.

Usable examples of the substrate 1 include, but are not particularly limited to, a glass substrate, a quartz substrate, and a resin substrate.

The gate electrode 2 may be constituted by any electrically conductive material. For example, the gate electrode 2 can be constituted by various metal materials such as gold (Au), platinum (Pt), silver (Ag), copper (Cu), palladium (Pd), rubidium (Rb), rhodium (Rh), aluminum (Al), titanium (Ti), molybdenum (Mo), tantalum (Ta), silicon (Si), or an alloy thereof.

The gate insulating film 3 may be constituted by any insulating material. For example, the gate insulating film 3 may be either (i) an inorganic insulating film composed of an inorganic material such as silicon oxide, aluminum oxide, or tantalum oxide, or (ii) an organic insulating film composed of an organic material such as parylene, polyimide, or polyvinyl phenol.

The source electrode 4 and the drain electrode 5 are constituted by any electrically conductive materials that can bind sulfur atoms (thiol groups) of the thiol compound layers 8 and 9 to surfaces of the electrodes, respectively. It is preferable that the source electrode 4 and the drain electrode 5 be constituted by materials that are low in electrical resistance and that facilitate chemical bonds to the sulfur atoms (thiol groups) of the thiol compound layers 8 and 9, respectively. For example, it is preferable that the source electrode 4 and the drain electrode 5 be each constituted by at least one material selected from the group consisting of gold (Au), silver (Ag), copper (Cu), platinum (Pt), palladium (Pd), and an alloy thereof. This causes thiol-metal reactions that generate chemical bonds via which thiol groups of benzenethiol compounds constituting the thiol compound layers 8 and 9 bind to metal materials constituting the source and drain electrodes 4 and 5, respectively. That is, this makes it possible to easily bind the thiol groups of the thiol compound layers 8 and 9 to the surfaces of the source and drain electrodes 4 and 5, respectively. In the result, it becomes possible to form the thiol compound layers 8 and 9 tightly on the source and drain electrodes 4 and 5, respectively, with high reproducibility. Therefore, organic thin-film transistors 100 that vary less in device characteristic such as threshold voltage can be provided.

The source electrode 4 and the drain electrode 5 may be constituted by either identical or different materials. However, it is preferable that the source electrode 4 and the drain electrode 5 be constituted by identical materials, because when they are constituted by identical materials they can be formed in a single step.

The silane compound layer 6 is provided on an exposed portion of a surface of the gate insulating film 3. That is, the silane compound layer 6 is in a region on the gate insulating film 3 where neither the source electrode 4 nor the drain electrode 5 is present. The silane compound layer 6 has a portion located between the source electrode 4 and the drain electrode 5 in contact with the organic semiconductor layer 7. The silane compound layer 6 is constituted by a silane compound. A example of the silane compound constituting the silane compound layer 6 is a disilazane derivative or alkylsilane having a halogen group such as a chloro group or a functional group such as an alkoxy group in a site that binds chemically to the surface of the gate insulating film 3. Specific examples of the silane compound include, but are not limited to, hexamethyldisilazane, octadecyltrichlorosilane, and octadecyltrimethoxysilane. Further, it is desirable that the silane compound layer 6 be constituted by a silane compound that can bind to the gate insulating film 3 and that does not bind chemically to the materials respectively constituting the source and drain electrodes 4 and 5 and does not corrode the electrode materials.

Further, it is preferable that the silane compound constituting the silane compound layer 6 per se not have such a functional group (e.g., —$NH_2$, —OH) that a new trap is set up. For example, it is preferable that the silane compound be hexamethyldisilazane, which was used in Examples below. This makes it possible to prevent a reduction in mobility.

Thus, the organic thin-film transistor 100 has the silane compound layer 6 provided in such a portion on the surface of the gate insulating film 3 as to make contact with the organic semiconductor layer 7. This causes a silane compound molecule constituting the silane compound layer 6 and —OH on the surface of the gate insulating film 3 to bind together to form an —O—Si— bond. This makes it possible to destroy an electron trap. Further, a hole trap and the organic semiconductor layer 7 can be placed at a distance corresponding to the thickness of the silane compound layer 6. This makes it possible to reduce the number of hole traps that are present on the interface between the gate insulating film 3 and the silane compound layer 6. Therefore, high mobility can be obtained.

Further, the silane compound layer 6 is constituted by a material different from those by which the after-mentioned thiol compound layers 8 and 9 for controlling the threshold voltage are constituted. This makes it possible to control the surface of the gate insulating film 3 independently of the threshold voltage. Therefore, higher mobility can be obtained through the silane compound layer 6 while selectively controlling the threshold voltage with the thiol compound layers 8 and 9. In particular, it becomes possible to obtain a large drain current with few traps.

The organic semiconductor layer 7 is a layer that consists primarily of an organic material. The organic semiconductor layer 7 is constituted by any organic semiconductor that is used for a conventional publicly-known organic thin-film transistor. For example, the organic semiconductor layer 7 can be constituted by an organic semiconductor material such as fullerene, a fullerene derivative, pentacene, a pentacene derivative, a perylene derivative, phthalocyanine, oligothiophene, or polythiophene. It is preferable that the organic semiconductor layer 7 be constituted by fullerene, a fullerene derivative, pentacene, or a pentacene derivative.

Fullerene or a derivative thereof is one of the organic semiconductor materials that have satisfactory current characteristics, and also is one of the materials that are currently drawing most attention as n-type organic semiconductor materials. For this reason, an organic thin-film transistor 100 having an organic semiconductor layer 7 composed of fullerene or a derivative thereof can give high mobility. Therefore, the organic semiconductor layer 7 composed of fullerene or a derivative thereof, in addition to the provision of the thiol compound layers 8 and 9 on the source and drain electrodes 4 and 5, makes it possible to control the threshold voltage while retaining high mobility. That is, a large drain current can be obtained through the organic semiconductor layer 7 while independently controlling the threshold voltage with the thiol compound layers 8 and 9.

Meanwhile, pentacene or a derivative thereof is one of the organic semiconductor materials that have satisfactory current characteristics, and also is one of the materials that are currently drawing most attention as p-type organic semiconductor materials. For this reason, an organic thin-film transistor 100 having an organic semiconductor layer 7 composed of pentacene or a derivative thereof can give high mobility. Therefore, the organic semiconductor layer 7 composed of pentacene or a derivative thereof, in addition to the provision of the thiol compound layers 8 and 9 on the source and drain electrodes 4 and 5, makes it possible to control the threshold voltage while retaining high mobility. That is, a large drain current can be obtained through the organic semiconductor layer 7 while independently controlling the threshold voltage with the thiol compound layers 8 and 9.

The thiol compound layer 8 covers all of the surface of the source electrode 4, and the thiol compound layer 9 covers all of the surface of the drain electrode 5. However, the thiol compound layer 8 only needs to be provided in at least such a portion on the surface of the source electrode 4 as to make electrical contact with the organic semiconductor layer 7. Similarly, the thiol compound layer 9 only needs to be provided in at least such a portion on the surface of the drain electrode 5 as to make electrical contact with the organic semiconductor layer 7.

Thus, it can be said that the surfaces of the source and drain electrodes 4 and 5 have been treated with the thiol compound layers 8 and 9, respectively.

The thiol compound layers 8 and 9 are respectively constituted by benzenethiol compounds each having an electron-donating group bonded to a benzene ring.

Specifically, each of the benzenethiol compounds respectively constituting the thiol compound layers 8 and 9 is an organic compound having one or more thiol groups (—SH) bonded to a benzene ring. That is, the benzenethiol compound is an aromatic organic thiol compound having a thiol group within a molecule. The benzenethiol compound only needs to have one or more thiol groups.

Furthermore, in addition to a thiol group, the benzenethiol compound has, as a functional group other than the thiol group, an electron-donating group bonded to the benzene ring. That is, the benzenethiol compound has one or more electron-donating groups having substituted one or more hydrogen atoms to bond to the benzene ring. The benzenethiol compound may be either a single-substituted substance (single-substituted benzenethiol compound) having one electron-donating group bonded to a benzene ring, or a multiple-substituted substance (multiple-substituted benzenethiol compound) having a plurality of electron-donating groups bonded to a benzene ring. In cases where the benzenethiol compound is a multiple-substituted substance, the benzenethiol compound may have either identical or different electron-donating groups bonded to the benzene ring.

Examples of such an electron-donating group include a hydrocarbon group, an amino group, a hydroxyl group, and an alkoxy group.

Specifically, the hydrocarbon group is a straight-chain, branched-chain, or cyclic saturated or unsaturated hydrocarbon group. More specifically, examples of the hydrocarbon group include: an alkyl group such as a methyl group, an ethyl group, a propyl group, or an isopropyl group; an alkenyl group such as an allyl group; an alkynyl group such as a methine group; a cycloalkyl group such as a cyclopentyl group, a cyclohexyl group, or a methylcyclohexyl group; a cycloalkenyl group such as a cyclopentenyl group, a cyclohexenyl group, or a methylcyclohexenyl group; and an aryl group such as a phenyl group.

The amino group may be a primary amino group represented by —NH$_2$, a secondary amino group obtained by substituting either of the hydrogen atoms of the primary amino group, or a tertiary amino group obtained by substituting both of the hydrogen atoms of the primary amino group. An example of the secondary amino group is an alkylamino group either of whose hydrogen atoms has been substituted by an alkyl group. An example of the tertiary amino group is a dialkylamino group both of whose hydrogen atoms have substituted by alkyl groups.

The alkoxy group is a functional group having the aforementioned hydrocarbon group having substituted the hydrogen of a hydroxyl group. Examples of the alkoxy group include a methoxy group, an ethoxy group, a propoxy group, and a phenoxy group.

Further, the benzenethiol compound only needs to have one or more thiol groups (—SH) within a molecule. That is, the benzenethiol compound may be either monovalent or polyvalent thiol.

It is preferable that such a benzenethiol compound have, as an electron-donating group bonded to a benzene ring, at least one functional group selected from the group consisting of an alkyl group, an amino group, a hydroxyl group, and an alkoxy group, and it is more preferable that such a benzenethiol compound have, as an electron-donating group bonded to a benzene ring, a functional group that is at least either an alkyl group or an amino group. Specifically, examples of the benzenethiol compound include, but are not limited to, 4-methylbenzenethiol, 3-methylbenzenethiol, 3,4-dimethylbenzenethiol, 3,5-dimethylbenzenethiol, 4-aminobenzenethiol, 3-aminobenzenethiol, 4-dimethylaminobenzenethiol, 3-dimethylaminobenzenethiol, 3-hydroxybenzenethiol, 4-methoxybenzenethiol, and 3-methoxybenzenethiol.

Thus, it is preferable that the thiol compound layers 8 and 9 be respectively constituted by benzenethiol compounds each having, as an electron-donating group bonded to a benzene ring, a functional group that is at least either an alkyl group or an amino group. For example, it is more preferable that the thiol compound layers 8 and 9 be each composed of 4-aminobenzenethiol, 4-methylbenzenethiol, or 4-dimethylaminobenzenethiol. This makes it possible to control the threshold voltage more easily.

The thiol compound layers 8 and 9 may be constituted by either identical or different materials. However, it is preferable that the thiol compound layers 8 and 9 be constituted by identical materials, because when they are constituted by identical materials they can be formed in a single step.

Further, it is preferable that the thiol groups of the aromatic thiol compounds constituting the thiol compound layers 8 and 9 be on the surfaces of the source and drain electrodes 4 and 5 in such a way as to bind chemically to the materials constituting the source and drain electrodes 4 and 5, respectively. For example, when the source electrode 4 and the drain electrode 5 are each constituted by at least one material selected from the group consisting of gold (Au), silver (Ag), copper (Cu), platinum (Pt), palladium (Pd), and an alloy thereof, the thiol compound layers 8 and 9 bind to the source and drain electrodes 4 and 5 via chemical bonds generated by thiol-metal reactions, respectively. In the result, it becomes possible to form the thiol compound layers 8 and 9 tightly on the source and drain electrodes 4 and 5, respectively, with high reproducibility. This reduces variations in device characteristic such as threshold voltage among organic thin-film transistors 100. Furthermore, the thiol compound layers 8 and 9 also make it possible to reduce current degradation between the source electrode 4 and the drain electrode 5.

The chemical bonds between the thiol compound layers 8 and 9 and the source and drain electrodes 4 and 5, respectively, are not limited to chemical bonds generated by such thiol-metal reactions as mentioned above, and may each be a bond such as a covalent bond, an ionic bond, or a coordinate bond.

Thus, the organic thin-film transistor 100 of the present embodiment makes it possible to easily control the threshold voltage by selecting benzenethiol compounds by which the thiol compound layers 8 and 9 are constituted, respectively. That is, it becomes possible to obtain a threshold voltage peculiar to the benzenethiol compounds selected. It should be noted that the benzenethiol compounds can be selected with use dipole moment as an index to some extent.

As described above, the organic thin-film transistor 100 is configured to have the thiol compound layers 8 and 9 provided in such portions on the surfaces of the source and drain electrodes 4 and 5, respectively, as to make electrical contact with the organic semiconductor layer 7. This makes it possible to selectively control the threshold voltage without greatly affecting a current characteristic other than the threshold voltage.

(2) Method for Manufacturing the Organic Thin-Film Transistor

Figure 2:
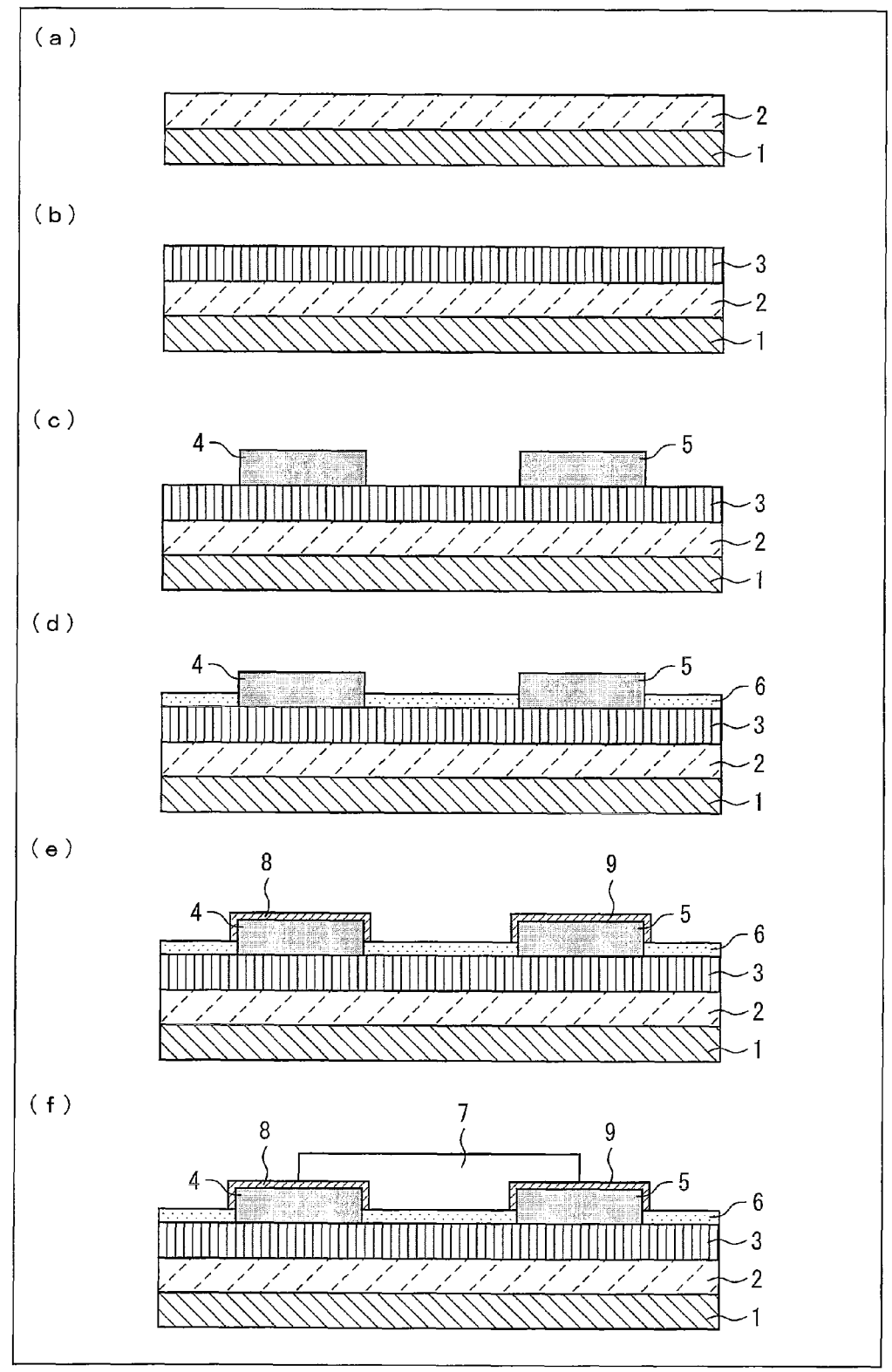
FIG. 2 is a cross-sectional view showing manufacturing steps of a method for manufacturing the organic thin-film transistor of FIG. 1.

A method for manufacturing the organic thin-film transistor 100 of the present embodiment is described below. FIG. 2 is a cross-sectional view showing manufacturing steps of a method for manufacturing the organic thin-film transistor of FIG. 1. The manufacturing method described below is an example, and does not imply any limitation.

The method for manufacturing the organic thin-film transistor 100 includes the step of forming the thiol compound layer 8 on the source electrode 4 and the thiol compound layer 9 on the drain electrode 5. More specifically, the method for manufacturing the organic thin-film transistor 100 includes the steps of: forming the gate electrode 2 on the substrate 1; forming the gate insulating film 3 on the gate electrode 2; forming the source electrode 4 and the drain electrode 5 on the gate insulating film 3 at a distance from each other; forming the organic semiconductor layer 7 on the gate insulating film 3 so that the organic semiconductor layer 7 is interposed between the source electrode 4 and the drain electrode 5; and forming the thiol compound layers 8 and 9 in such portions on the surfaces of the source and drain electrodes 4 and 5, respectively, that the thiol compound layers 8 and 9 make electrical contact with the organic semiconductor layer 7. Each of the steps is described below.

(a) Step of Forming the Gate Electrode

As shown in (a) of FIG. 2, the gate electrode 2 is formed by forming a metal thin film on the substrate 1.

For simplification of explanation, the present embodiment describes a case where the gate electrode 2 is formed on an entire surface of the substrate 1. However, the gate electrode 2 is not limited to being formed on the entire surface of the substrate 1. It is possible to form a patterned gate electrode 2 by means of a photolithographic method or by use of shadow mask.

(b) Step of Forming the Gate Insulating Film

Next, as shown in (b) of FIG. 2, the gate insulating film 3 is formed so that the gate electrode 2 is overlapped with the gate insulating film 3. The gate insulating film 3 can be manufactured by means of various methods such as normal vacuum deposition, sputtering film formation, a CVD method, a spin-coating method, or an ink-jet method.

(c) Step of Forming the Electrodes

Then, as shown in (c) of FIG. 2, the source electrode 4 and the drain electrode 5 are formed on the gate insulating film 3 at a distance from each other.

The source electrode 4 and the drain electrode 5 are pattern-formed with use of a printing technique such as an ink-jet method, as well as a photolithographic technique, an etching process, or a liftoff process that is used in a normal semiconductor process. Further, the source electrode 4 and the drain electrode 5 are each constituted by a material that can be formed with use of various methods such as a normal vacuum deposition method, a sputter film-forming method, or a print process.

(d) Step of Forming the Silane Compound Layer

Next, as shown in (d) of FIG. 2, the silane compound layer 6, composed of a silane compound, is formed on the surface of the gate insulating film 3.

Usable examples of methods for forming the silane compound layer 6 include, but are not particularly limited to, a gas phase method for forming the silane compound layer 6 by exposing the surface of the gate insulating film 3 to silane-compound vapor, a dip method for forming the silane compound layer 6 by dipping the substrate 1 directly in an undiluted silane-compound liquid or a silane-compound solution diluted with an appropriate solvent, and a spin-coating method for forming the silane compound layer 6 by spin coating.

After the silane compound layer 6 is formed on the gate insulating film 3 above the substrate 1 by means of these techniques, the substrate 1 is rinsed with an organic solvent or the like. This makes it possible to remove an excess silane compound. This causes the silane compound layer 6 to be formed to bind selectively onto the gate insulating film 3.

It is preferable here that the silane compound layer 6 be constituted by a silane compound that can bind to the gate insulating film 3 and that binds to neither the source electrode 4 nor the drain electrode 5. This causes the silane compound layer 6 to be formed selectively on the exposed surface of the gate insulating film 3 and formed on neither the source electrode 4 nor the drain electrode 5, as shown in (d) of FIG. 2.

(e) Step of Forming the Thiol Compound Layers.

Next, as shown in (e) of FIG. 2, the thiol compound layer 8 is formed on the surface of the source electrode 4, and the thiol compound layer 9 is formed on the surface of the drain electrode 5.

The thiol compound layers 8 and 9 are formed by bringing gases, liquids, or solids containing such benzenethiol compounds as mentioned above into contact with the electrode surfaces on which the thiol compound layers 8 and 9 are formed, respectively. In the case of a benzenethiol compound that takes the form of a liquid or solid at room temperature under normal pressure, the surface of the source electrode 4 and the surface of the drain electrode 5 are each brought into contact with a solution prepared by dissolving such a benzenethiol compound in a solvent such as ethanol or acetonitrile. This causes the thiol compound layers 8 and 9 to be formed. In this case, the amount of the benzenethiol compound that adheres can be controlled by adjusting the duration of such contact. That is, it becomes possible to control the thickness of each of the thiol compound layers 8 and 9.

Alternatively, in the case of a benzenethiol compound that takes the form of a gas at room temperature under normal pressure or that becomes a gas in response to heating, the surface of the source electrode 4 and the surface of the drain electrode 5 are each brought into contact with such a gas. This causes the thiol compound layers 8 and 9 to be formed. In this case, too, the amount of the benzenethiol compound that adheres can be controlled by adjusting the duration of such contact in a gas phase. That is, it becomes possible to control the thickness of each of the thiol compound layers 8 and 9.

Next, after the benzenethiol compounds are brought into contact with the surface of the source electrode 4 and the surface of the drain electrode 5, respectively, rinsing is performed with use of a organic solvent or the like. This makes it possible to remove an excess benzenethiol compound from the surface of the substrate 1. Thus, as shown in (e) of FIG. 2, the thiol compound layer 8 is formed on the surface of the source electrode 4, and the thiol compound layer 9 is formed on the surface of the drain electrode 5.

For simplification of explanation, the present embodiment is described in such a way that the surface of the source electrode 4 is entirely covered with the thiol compound layer 8 and the drain electrode 5 is entirely covered with the thiol compound layer 9. However, the thiol compound layer 8 only needs to be formed in at least such a region on the surface of the source electrode 4 as to make electrical contact with the organic semiconductor layer 7. Further, the thiol compound layer 9 only needs to be formed in at least such a region on the surface of the drain electrode 5 as to make electrical contact with the organic semiconductor layer 7. Further, the thiol compound layers 8 and 9 may be formed either entirely or sparsely in such regions on the respective electrode surfaces as to make electrical contact with the organic semiconductor layer 7.

It should be noted that in cases where the thiol compound layer 8 and the thiol compound layer 9 are composed of identical benzenethiol compounds, it becomes possible to form the thiol compound layer 8 and the thiol compound layer 9 simultaneously.

(f) Step of Forming the Organic Semiconductor Layer

Finally, as shown in (f) of FIG. 2, the organic semiconductor layer 7 is formed so that the source electrode 4 and the drain electrode 5 are overlapped with the organic semiconductor layer 7.

The organic semiconductor layer 7 can be produced with use of a vacuum deposition method by resistance heating. Further, in cases where the organic semiconductor layer 7 is constituted by a soluble material, the organic semiconductor layer 7 can be produced with use of a general technique such as a spreading technique or a print process.

Although in (f) of FIG. 2 the organic semiconductor layer 7 is formed to straddle between the source electrode 4 and the drain electrode 5, the organic semiconductor layer 7 may be formed over the entire surface above the substrate 1. That is, the organic semiconductor layer 7 may be formed over surfaces (exposed surface above the substrate 1), namely on a surface of the silane compound layer 6, over a surface of the source electrode 4, and over a surface of the drain electrode 5. However, from a point of view of parasitic capacitance and the like, it is preferable that the organic semiconductor layer 7 be pattern-formed so that the source electrode 4 and the drain electrode 5 are overlapped with the organic semiconductor layer 7.

Such steps as described above make it possible to manufacture the organic thin-film transistor 100 according to the present embodiment.

The present invention can be expressed as follows:

[1] An organic thin-film transistor of the present invention can be said to be an organic thin-film transistor having an organic semiconductor layer, a gate electrode, a gate insulating film, a source electrode, and a drain electrode provided above a substrate, the organic thin-film transistor including layers provided at least on such surfaces of the source and drain electrodes, respectively, as to make electrical contact with the organic semiconductor layer, the layers being respectively composed of thiol compounds.

According to such a configuration, the provision of the layers respectively composed of the thiol compounds at least on such surfaces of the source and drain electrodes, respectively, as to make electrical contact with the organic semiconductor layer makes it possible to control the threshold voltage, and to provide an organic thin-film transistor low in current degradation between the source electrode and the drain electrode.

[2] The organic thin-film transistor as set forth in [1], wherein each of the thiol compounds is a benzenethiol derivative having at least one functional group selected from among an alkyl group, an amino group, a hydroxyl group, an alkylamino group, a dialkylamino group, and an alkoxy group. Thus, the selection as each of the thiol compounds of a benzenethiol derivative having at least one functional group selected from among an alkyl group, an amino group, a hydroxy group, an alkylamino group, a dialkylamino group, and an alkoxy group makes it possible to easily control the threshold voltage.

[3] The organic thin-film transistor as set forth in [1] and [2], wherein the thiol compounds have thiol groups binding to surfaces of materials constituting the source and drain electrodes, respectively. According to this configuration, the binding of the thiol groups of the thiol compounds to the materials constituting the source and drain electrodes makes it possible to form the layers respectively composed of the thiol compounds tightly on the electrodes with high reproducibility, thus making it possible to provide organic thin-film transistors that vary less in device characteristic such as threshold voltage.

[4] The organic thin-film transistor as set forth in any one of [1] to [3], wherein the source electrode and the drain electrode are respectively formed from materials each composed of gold, silver, copper, platinum, palladium, or a compound thereof. Thus, the selection of materials from among gold, silver, copper, platinum, palladium, and a compound thereof to constitute the source and drain electrodes makes it possible to easily bind the thiol groups to the source and drain electrodes.

[5] The organic thin-film transistor as set forth in any one of [1] to [4], wherein the organic semiconductor layer is composed of fullerene or a derivative thereof.

[6] The organic thin-film transistor as set forth in any one of [1] to [4], wherein the organic semiconductor layer is composed of pentacene or a derivative thereof.

Thus, the use of fullerene or a derivative thereof or pentacene or a derivative thereof as the organic semiconductor layer makes it possible to obtain a large drain current while controlling the threshold voltage.

[7] The organic thin-film transistor as set forth in any one of [1] to [6], further including a layer provided on such a surface of the gate insulating film as to make contact with the organic semiconductor layer, the layer being composed of a silane compound. In the organic thin-film transistor of the present invention, the provision of the threshold-voltage-controlling thiol compounds on such surfaces of the source and drain electrodes as to make contact with the organic semiconductor layer makes it possible to independently control the surface of the gate insulating film. In particular, the provision of the layer composed of the silane compound on the surface of the gate insulating film makes it possible to obtain a large drain current with few traps.

As described above, an organic thin-film transistor according to the present invention includes thiol compound layers provided in such portions on the source and drain electrodes, respectively, as to make electrical contact with the organic semiconductor layer, the thiol compound layers being respectively composed of benzenethiol compounds each having an electron-donating group bonded to a benzene ring.

As described above, a method according to the present invention for manufacturing an organic thin-film transistor includes the step of forming thiol compound layers in such portions on the source and drain electrodes, respectively, that the thiol compound layers make electrical contact with the organic semiconductor layer, the thiol compound layers being respectively composed of benzenethiol compounds each having an electron-donating group bonded to a benzene ring.

This brings about an effect of making it possible to selectively control the threshold voltage without greatly affecting a current characteristic other than the threshold voltage.

The organic thin-film transistor of the present invention is preferably configured such that each of the benzenethiol compounds has, as the electron-donating group, a functional group that is at least either an alkyl group or an amino group.

The organic thin-film transistor of the present invention is preferably configured such that each of the benzenethiol compounds is 4-aminobenzenethiol, 4-methylbenzenethiol, or 4-dimethylaminobenzenethiol.

According to each the foregoing configurations, the thiol compound layers are respectively constituted by benzenethiol compounds each having, as an electron-donating group, a functional group that is at least either an alkyl group or an amino group. This makes it possible to control the threshold voltage more surely.

The organic thin-film transistor of the present invention is preferably configured such that the benzenethiol compounds have thiol groups having chemical bonds to materials constituting the source and drain electrodes, the thiol groups being on surfaces of the source and drain electrodes, respectively.

According to the foregoing configuration, the thiol compound layers bind to the source and drain electrodes via the chemical bonds, respectively. This makes it possible to form the thiol compound layers tightly on the source and drain electrodes, respectively, with high reproducibility. Therefore, organic thin-film transistors that vary less in device characteristic such as threshold voltage can be provided.

The organic thin-film transistor of the present invention is preferably configured such that the source electrode and the drain electrode are respectively composed of materials each selected from the group consisting of gold (Au), silver (Ag), copper (Cu), platinum (Pt), palladium (Pd), and an alloy thereof.

According to the foregoing configuration, the source electrode and the drain electrode are respectively composed of materials each selected from the group consisting of gold (Au), silver (Ag), copper (Cu), platinum (Pt), palladium (Pd), and an alloy thereof. This causes the thiol compound layers to bind to the source and drain electrodes via chemical bonds generated by thiol-metal reactions, respectively. This makes it possible to form the thiol compound layers tightly on the source and drain electrodes, respectively, with high reproducibility. Therefore, organic thin-film transistors that vary less in device characteristic such as threshold voltage can be provided.

The organic thin-film transistor of the present invention is preferably configured such that the organic semiconductor layer is composed of fullerene or a derivative thereof.

According to the foregoing configuration, the organic semiconductor layer is constituted by fullerene, which is an n-type semiconductor material, or a derivative thereof. This makes it possible to obtain a large drain current through the organic semiconductor layer composed of fullerene or a derivative thereof, while independently controlling the threshold voltage with the thiol compound layers.

The organic thin-film transistor of the present invention is preferably configured such that the organic semiconductor layer is composed of pentacene or a derivative thereof.

According to the foregoing configuration, the organic semiconductor layer is constituted by pentacene, which is a p-type semiconductor material, or a derivative thereof. This makes it possible to obtain a large drain current through the organic semiconductor layer composed of pentacene or a derivative thereof, while independently controlling the threshold voltage with the thiol compound layers.

The organic thin-film transistor of the present invention is preferably configured to further include a silane compound layer provided in such a portion on a surface of the gate insulating film as to make contact with the organic semiconductor layer, the silane compound layer being composed of a silane compound.

The foregoing configuration has the silane compound layer provided on such a surface of the gate insulating film as to make contact with the organic semiconductor layer, the silane compound layer being composed of a silane compound. This causes a silane compound molecule and —OH on the surface of the gate insulating film to bind together to form an —O—Si— bond. This makes it possible to destroy an electron trap. Further, a hole trap and the organic semiconductor layer can be placed at a distance corresponding to the thickness of the silane compound layer. This makes it possible to reduce the number of hole traps that are present on the interface between the gate insulating film and the silane compound layer. Therefore, high mobility can be obtained.

Furthermore, this silane compound layer is constituted by a material different from that by which the thiol compound layers for controlling the threshold voltage are constituted. This makes it possible to control the surface of the gate insulating film independently of the threshold voltage. Therefore, higher mobility can be obtained through the silane compound layer while selectively controlling the threshold voltage with the thiol compound layers. In particular, it becomes possible to obtain a large drain current with few traps.

Although the embodiments above have various technically preferable limitations for carrying out the invention, the scope of the present invention is not limited to the description of the embodiments and drawings above. That is, the present invention is not limited to the description of the embodiments above, but may be altered by a skilled person within the scope of the claims. An embodiment based on a proper combination of technical means disclosed in different embodiments is encompassed in the technical scope of the present invention.

EXAMPLES

The present invention is described below in concrete terms by way of Examples.

Example 1

Figure 3:
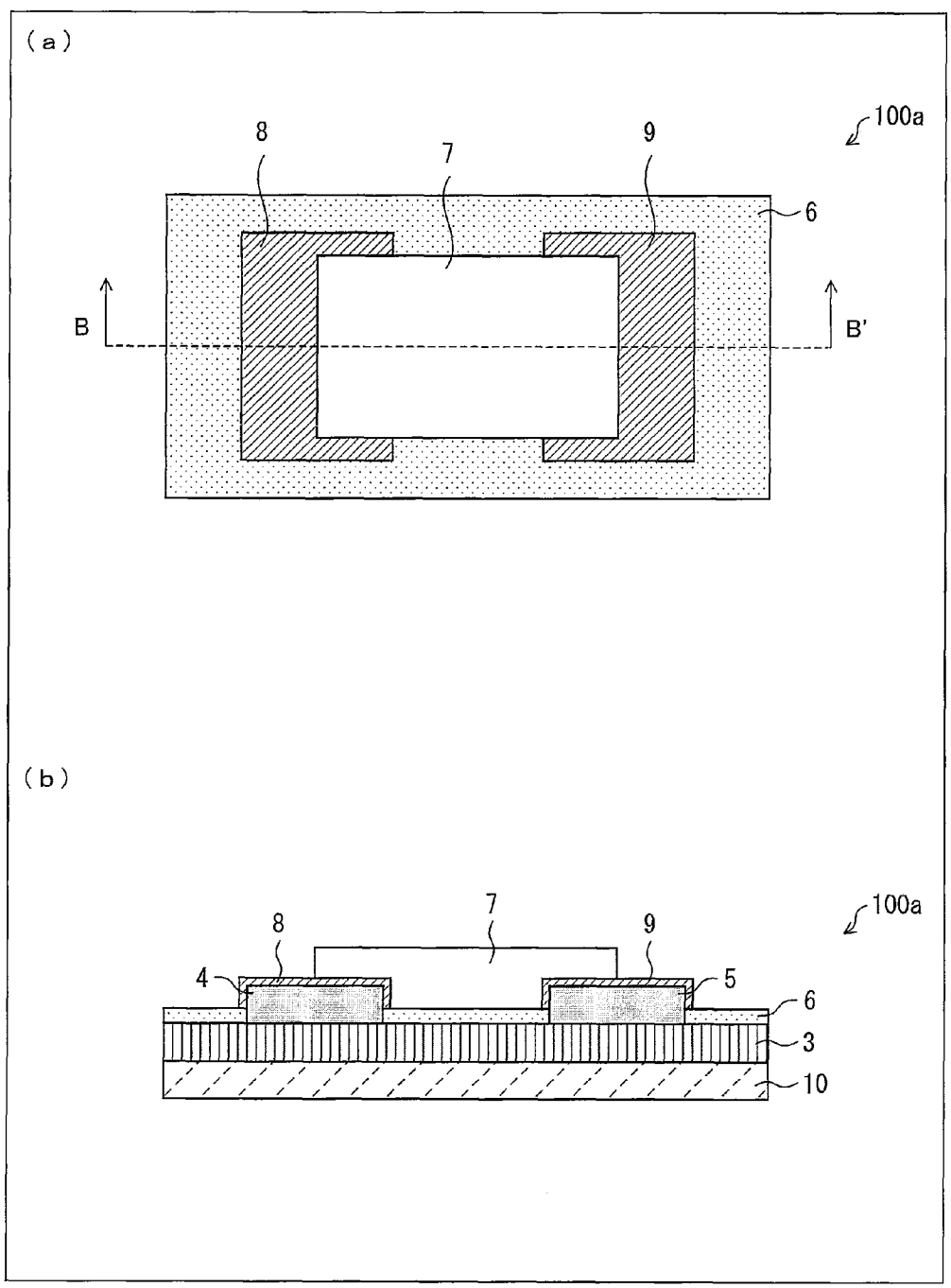
FIG. 3 shows the configuration of a relevant part of an organic thin-film transistor according to Example 1 of the present invention, (a) of FIG. 3 being a top view, (b) of FIG. 3 being a cross-sectional view taken along the line B-B' in (a) of FIG. 3.
Figure 4:
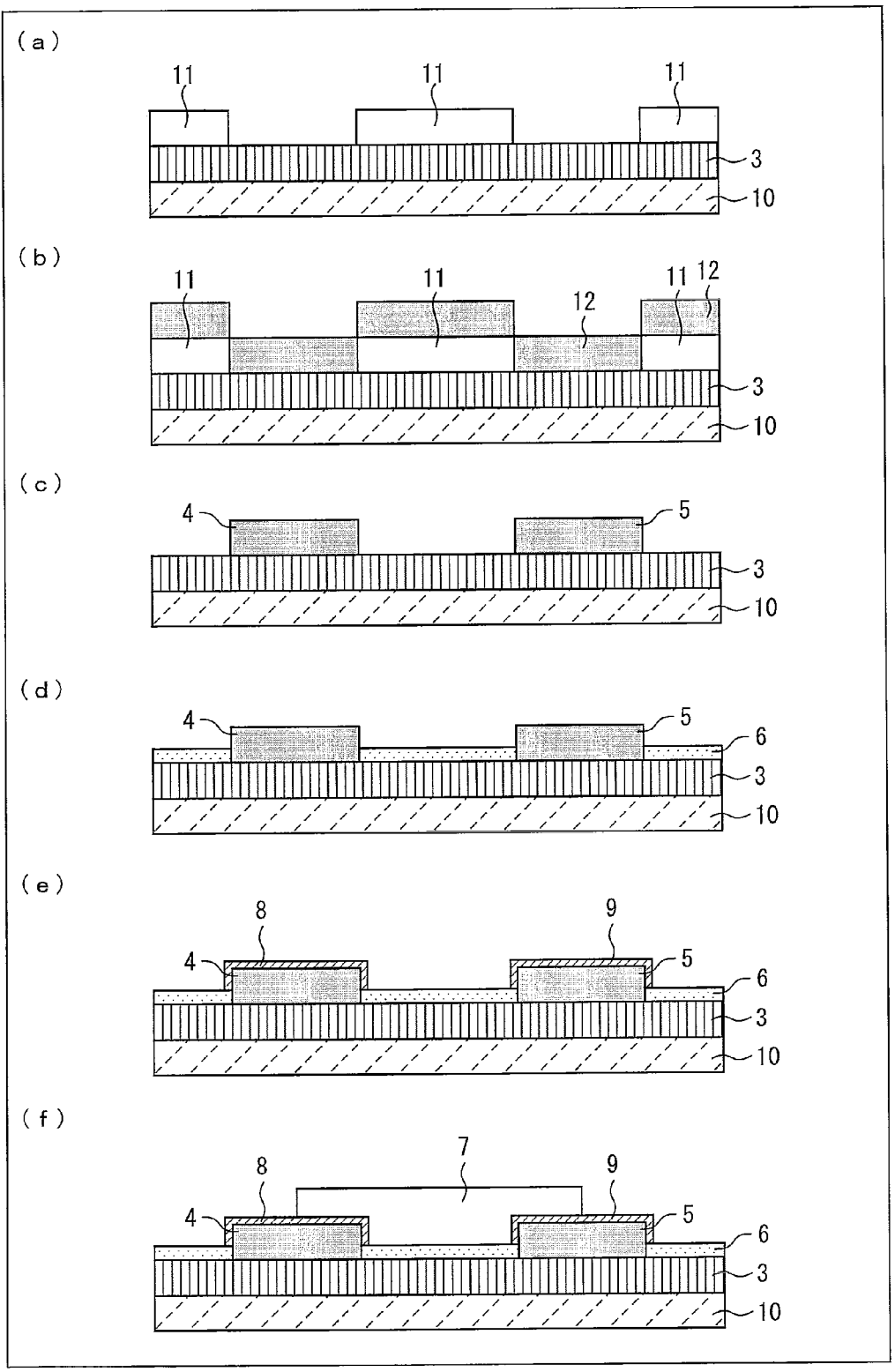
FIG. 4 is a cross-sectional view showing manufacturing steps of a method for manufacturing the organic thin-film transistor of FIG. 3.

Example 1 describes an example of manufacture of such an organic thin-film transistor 100a as shown in FIG. 3 with use of fullerene, which an n-type semiconductor material. (a) of FIG. 3 is a top view, and (b) of FIG. 3 is a cross-sectional view taken along the line B-B'. FIG. 4 is a cross-sectional view showing manufacturing steps of a method for manufacturing the organic thin-film transistor 100a of FIG. 3. It should be noted that the organic thin-film transistor 100a of FIG. 3 is configured substantially in the same manner as is the organic thin-film transistor 100 of FIG. 1, and is different from the organic thin-film transistor 100 of FIG. 1 in that the substrate 1 and the gate electrode 2 have been replaced by a substrate 10 that serves also as a gate electrode.

The manufacturing steps of the method for manufacturing the organic thin-film transistor 100a of FIG. 3 are described below with reference to (a) through (f) of FIG. 4.

First, as shown in (a) of FIG. 4, an N-type single-crystal silicon substrate was used as the substrate that serves also as a gate electrode, and a thermally-oxidized film of silicon having a film thickness of 310 nm was formed on the substrate 10 as a gate insulating film 3. Next, a photoresist film 11 having openings was produced on the gate insulating film 3 so that a source electrode 4 and a drain electrode 5 could be produced.

Next, as shown in (b) of FIG. 4, a metal thin film 12 composed of gold (Au) with a film thickness of 25 nm was deposited by means of a vacuum deposition method.

After that, in order to remove the photoresist film 11, a liftoff step of dipping the substrate 10 in an acetone solvent was carried out to remove unwanted gold that had been on the photoresist film 11, whereby the source electrode 4 and the drain electrode 5 were formed on the gate insulating film 3, as shown in (c) of FIG. 4, with a channel length of 10 μm therebetween.

Next, a silane compound layer 6 was formed on the gate insulating film 3 by putting the substrate 10, on which the gate insulating film 3, the source electrode 4, and the drain electrode 5 had been formed, into an airtight container, together with hexamethyldisilazane (hereinafter referred to as "HMDS"), which is a silane compound. Then, the substrate 10 was exposed to HMDS vapor for two minutes at room temperature under atmospheric pressure. After exposure, rinse treatment was carried out with use of a toluene solvent to remove an excess HMDS material from the substrate 10, whereby the silane compound layer 6 was formed on the gate insulating film 3 as shown in (d) of FIG. 4.

At this point, the silane compound does not bind to gold constituting the source electrode 4 and the drain electrode 5. For this reason, HMDS materials having adhered to the source electrode 4 and the drain electrode 5 in the airtight container are removed by the rinse treatment, so that the silane compound layer 6 is formed on neither the source electrode 4 nor the drain electrode 5.

Next, a thiol compound layer 8 and a thiol compound layer 9 were formed on the source electrode 4 and the drain electrode 5, respectively. Specifically, first, 15 mM solutions of the following aromatic thiol compounds (A), (B), and (C) were prepared by solving the compounds in acetonitrile, respectively. Then, substrates 10 of (d) of FIG. 4 were dipped in the solutions, respectively, whereby the aromatic thiol compounds were adsorbed on the respective source electrodes 4 and the respective drain electrodes 5 for the purpose of threshold voltage control. After this absorptive treatment, each substrate 10 was rinsed with an acetonitrile solvent so that a less-adherent thiol compound was removed, whereby a thiol compound layer 8 and a thiol compound layer 9 were formed as shown in (e) of FIG. 4. It should be noted that the thiol compound layer 8 and the thiol compound layer 9 are formed from identical aromatic thiol compounds.

(A) 4-aminobenzenethiol;
(B) 4-methylbenzenethiol; and
(C) 4-dimethylaminobenzenethiol.

Finally, as shown in (f) of FIG. 4, an organic semiconductor layer 7 was formed with use of fullerene $C_{60}$, which is an electron-accepting organic semiconductor material. In Example 1, an organic semiconductor layer 7 having a film thickness of 100 nm was produced by using a vacuum deposition method to carry out deposition at a substrate temperature of 120° C. through a mask having a particular opening.

Thus, in Example 1, an organic thin-film transistor including thiol compound layers 8 and 9 composed of the benzenethiol compound (A), an organic thin-film transistor including thiol compound layers 8 and 9 composed of the benzenethiol compound (B), and an organic thin-film transistor including thiol compound layers 8 and 9 composed of the benzenethiol compound (C) were produced.

Comparative Example 1

An organic thin-film transistor of Comparative Example 1 was produced in the same manner as in Example 1, except that neither a thiol compound layer 8 nor 9 for controlling the threshold voltage was formed on the source or drain electrode 4 or 5 in an organic thin-film transistor of Example 1.

Comparison Between Example 1 and Comparative Example 1

The drain current $I_d$ (A) of each of the organic thin-film transistors of Example 1 and Comparative Example 1 was measured with voltage between the source and drain electrodes 4 and 5 in each organic thin-film transistor being 30 V ($V_D$) and with voltage (gate voltage $V_g$) between the source electrode 4 and the substrate 10 in each organic thin-film transistor varying from 0 V to 30 V.

Figure 5:
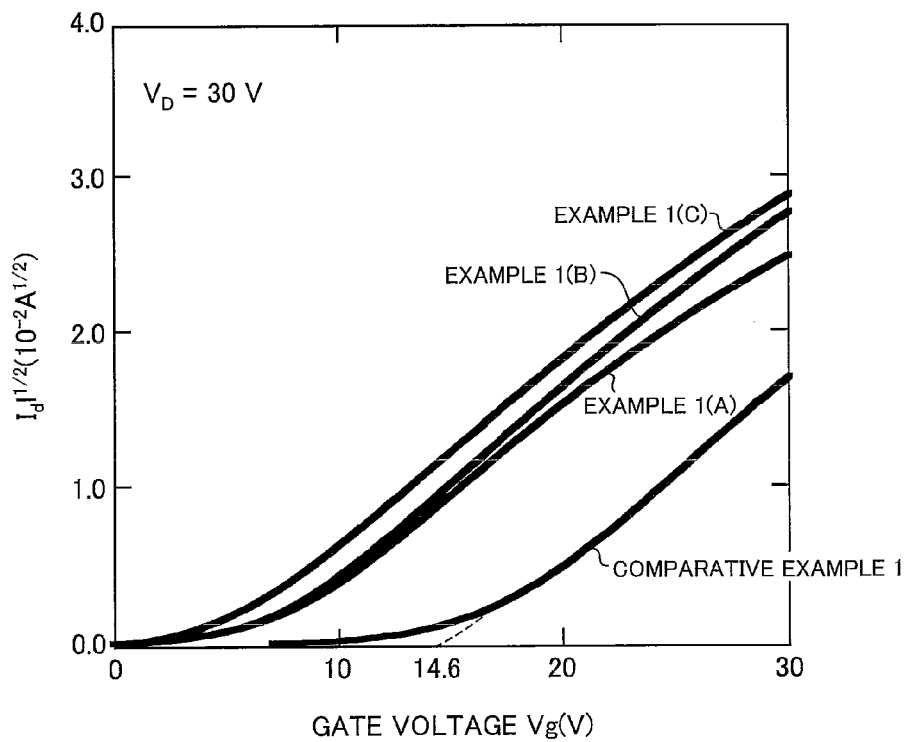
FIG. 5 is a graph showing correlations between drain voltage $I_d$ and gate voltage $V_g$ of organic thin-film transistors of Example 1 and Comparative Example 1 of the present invention.

FIG. 5 is a graph showing correlations between drain voltage $I_d$ (A) and gate voltage $V_g$ (V) of the organic thin-film transistors of Example 1 and Comparative Example 1. In the graph of FIG. 5, the horizontal axis represents gate voltage $V_g$ (V), and the vertical axis represents products obtained by multiplying square roots of the drain current $I_d$ by $10^{-2}$.

The threshold voltage $V_T$ of each of the organic thin-film transistors of Example 1 and Comparative Example 1 was recorded by extending the linear portions of the square-root characteristics of $I_d$ in the graph beyond the horizontal axis and reading the voltage values at which the linear portions intersected with the horizontal axis. For example, in the case of Comparative Example 1, the threshold voltage takes on a voltage value of 14.6 V, at which the dotted line of FIG. 5 intersects with the horizontal axis.

As shown in FIG. 5, as compared with the characteristic of Comparative Example 1, in which neither a thiol compound layer 8 nor 9 was formed, the results of Example 1 with the benzenethiol compounds (A), (B), and (C) replacing one after the other in the order named show that there are shifts in characteristics of Comparative Example 1, Example 1(A), Example 1(B), and Example 1(C) from right to left (from positive to negative) in the order named.

Table 1 below shows the respective characteristics of the organic thin-film transistors of Example 1 and Comparative Example 1. As evidenced by Table 1, the threshold voltage varies from 14.6 V to 5.0 V in this order, as the thiol compound layers 8 and 9 formed on the respective surfaces of the source and drain electrodes 4 and vary from Comparative Example 1, Example 1(A), Example 1(B), to Example 1(C) in the order named. This indicates that the threshold voltage can be controlled by appropriately selecting from among the benzenethiol compounds.

Meanwhile, Table 1 shows the mobility (g) and current on/off ratios of Comparative Example 1, Example 1(A), Example 1(B), and Example 1(C). As evidenced by Table 1, there is no great change in mobility (µ) even in cases where the thiol compounds vary from Comparative Example 1, Example 1(A), Example 1(B), to Example 1(C); and in each case, the current on/off ratio takes on a value of not less than $10^5$. This indicates that the threshold voltage can be selectively controlled without the thiol compounds, which serve to control the threshold voltage, greatly affecting a current characteristic other than the threshold voltage.

TABLE 1

| | $V_T$ (V) | µ (cm²/Vs) | Current on/off ratio |
|---|---|---|---|
| Comparative Example 1 | 14.6 | 2.6 | $5.2 \times 10^7$ |
| Example 1(A): 4-aminobenzenethiol | 7.0 | 2.5 | $3.4 \times 10^5$ |
| Example 1(B): 4-methylbenzenethiol | 6.6 | 2.7 | $3.0 \times 10^6$ |
| Example 1(C): 4-dimethylaminobenzenethiol | 5.0 | 2.5 | $2.7 \times 10^6$ |

Thus, the formation of the thiol compound layers 8 and 9, each composed of a benzenethiol compound, on the source and drain electrodes 4 and 5 makes it possible to selectively control the threshold voltage without greatly affecting a current characteristic other than the threshold voltage.

Comparative Example 2

An organic thin-film transistor of Comparative Example 2 was produced in the same manner as in Example 1, except that no silane compound layer 6 composed of hexamethyldisilazane was formed between the gate insulating film 3 and the organic semiconductor layer 7 in an organic thin-film transistor of Example 1.

Used as a thiol compound for controlling the threshold voltage was 4-methylbenzenethiol. As a result of measuring the characteristics of the organic thin-film transistor in the same manner as in Example 1, the threshold voltage ($V_T$) was 6.7 V, and the mobility (µ) was 0.5 cm²/Vs. Although there was a shift in threshold voltage as in Example 1, the mobility was low.

This result shows that the organic thin-film transistor of Example 1 can give more satisfactory transistor characteristics with little mobility degradation by having the thiol compound layers 8 and 9, which serve to control the threshold voltage, provided on the source and drain electrodes 4 and 5 and having the silane compound layer 6 provided on the surface of the gate insulating film 3.

Example 2

An organic thin-film transistor of Example 2 was produced in the same manner as in Example 1, except that pentacene, which is a p-type organic semiconductor material, was used as the organic semiconductor layer 7 in an organic thin-film transistor of Example 1 shown in FIG. 3.

The organic semiconductor layer 7 composed of pentacene was formed by deposition through a mask having a particular opening, with the substrate temperature set at room temperature, to have a film thickness of 60 nm. Used as a thiol compound for controlling the threshold voltage was 4-methylbenzenethiol.

Comparative Example 3

An organic thin-film transistor of Comparative Example 3 was produced in the same manner as in Example 2, except that neither a thiol compound layer 8 nor 9 for controlling the threshold voltage was formed on the source or drain electrode 4 or 5 in an organic thin-film transistor of Example 2. As in Example 2, pentacene was used as the organic semiconductor layer.

Comparison Between Example 2 and Comparative Example 3

The drain current $I_d$ (A) of each of the organic thin-film transistors of Example 2 and Comparative Example 3 was measured with voltage between the source and drain electrodes 4 and 5 in each organic thin-film transistor being −30 V ($V_D$) and with voltage (gate voltage $V_g$) between the source electrode 4 and the substrate 10 in each organic thin-film transistor varying from 5 V to −30 V.

Figure 6:
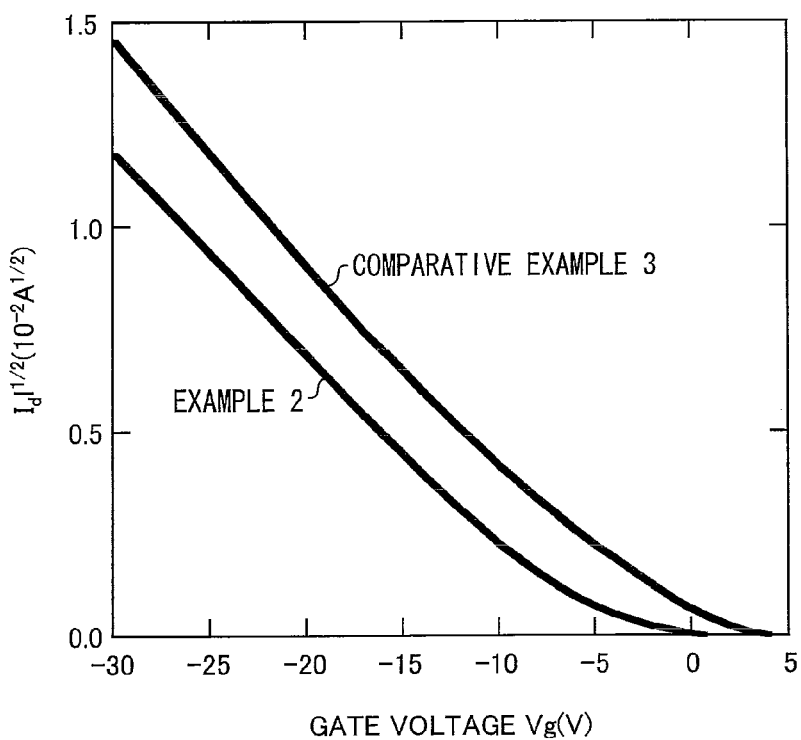
FIG. 6 is a graph showing correlations between drain voltage $I_d$ and gate voltage $V_g$ of organic thin-film transistors of Example 2 and Comparative Example 3 of the present invention.

FIG. 6 is a graph showing correlations between drain voltage $I_d$ (A) and gate voltage $V_g$ (V) of the organic thin-film transistors of Example 2 and Comparative Example 3. In the graph of FIG. 6, the horizontal axis represents gate voltage $V_g$ (V), and the vertical axis represents products obtained by multiplying square roots of the drain current $I_d$ by $10^{-2}$.

The threshold voltage $V_T$ of each of the organic thin-film transistors of Example 2 and Comparative Example 3 was recorded by extending the linear portions of the square-root characteristics of $I_d$ in the graph beyond the horizontal axis and reading the voltage values at which the linear portions intersected with the horizontal axis.

As shown in FIG. 6, as compared with the characteristic of Comparative Example 3, in which neither a thiol compound layer 8 nor 9 was formed, the characteristic of Example 2, in which the thiol compound layers 8 and 9 were formed by adsorbing 4-methylbenzenethiol to the source electrode 4 and the drain electrode 5, respectively, showed a negative shift. Whereas the threshold voltage ($V_T$) of Comparative Example 3 was −2.9 V, the threshold voltage ($V_T$) of Example 2 was −6.4 V.

Thus, it was confirmed that also in the thin-film transistor of Example 2, in which pentacene, which is a p-type organic semiconductor material, was used as the organic semiconductor layer, the threshold voltage can be controlled by providing the thiol compound layers 8 and 9 between the source electrode 4 and the organic semiconductor layer 7 and between the drain electrode 5 and the organic semiconductor layer 7, respectively, as in Example 1.

Example 3

Figure 7:
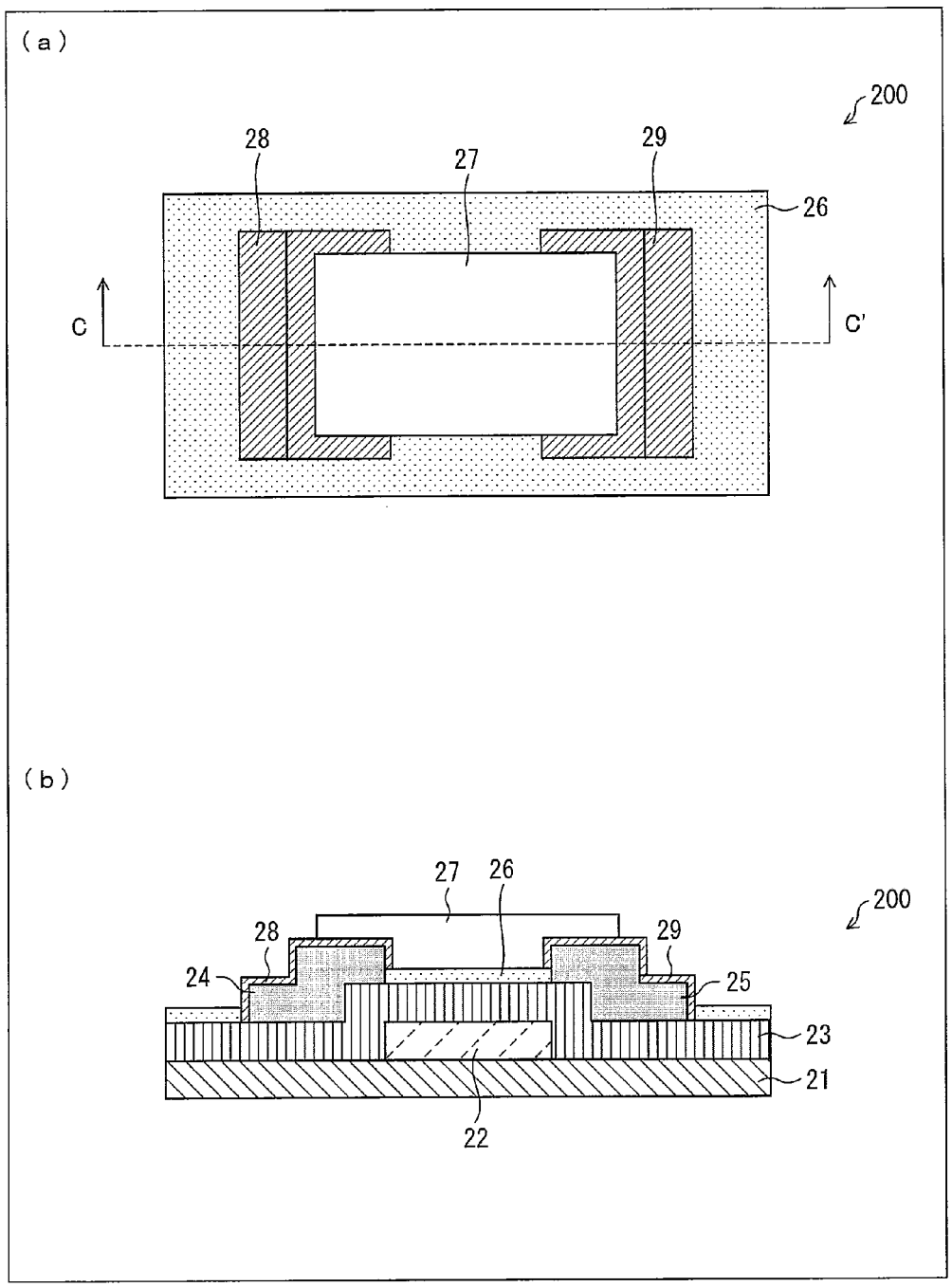
FIG. 7 shows the configuration of a relevant part of an organic thin-film transistor according to Example 3 of the present invention, (a) of FIG. 7 being a top view, (b) of FIG. 7 being a cross-sectional view taken along the line C-C' in (a) of FIG. 7.

An organic thin-film transistor of Example 3 has a structure in which a gate electrode has been patterned. FIG. 7 shows the configuration of a relevant part of an organic thin-film transistor 200 according to Example 3, (a) of FIG. 7 being a top view, (b) of FIG. 7 being a cross-sectional view taken along the line C-C' in (a) of FIG. 7.

The following describes manufacturing steps of a method for manufacturing the organic thin-film transistor of Example 3.

First, an aluminum-silicon (Al—Si) alloy film having a film thickness of 40 nm was formed by sputtering on a substrate 21 composed of glass.

Then, a gate electrode 22 was formed by patterning the aluminum-silicon (Al—Si) alloy film into a desired shape with use of photolithography and an etching process.

Next, a silicon oxide film ($SiO_2$) having a film thickness of 200 nm was formed on the gate electrode 22 by sputtering, whereby a gate insulating film 23 was produced.

Next, a source electrode 24 and a drain electrode 25 each composed of gold were produced with use of a resist film (not shown) by means of a liftoff method as in Example 1.

Then, a silane compound layer 26 composed of hexamethyldisilazane (HMDS) was formed on the gate insulating film 23 by exposing a surface of the gate insulating film 23 to HMDS vapor.

Next, a thiol compound layer 28 and a thiol compound layer 29 were formed on surfaces of the source and drain electrodes 24 and 25, respectively, by using 4-dimethylaminobenzenethiol as a benzenethiol compound for controlling the threshold voltage and by dipping the substrate 21 in an acetonitrile solution as in Example 1.

Finally, an organic semiconductor layer 27 having a film thickness of 100 nm was formed by depositing fullerene $C_{60}$ as in Example 1.

Through the process described above, the organic thin-film transistor of Example 3 shown in FIG. 7 was produced.

Comparative Example 4

An organic thin-film transistor of Comparative Example 4 was produced in the same manner as in Example 3, except that neither a thiol compound layer 28 nor 29 for controlling the threshold voltage was formed on the source or drain electrode 24 or 25 in an organic thin-film transistor of Example 3.

Comparison Between Example 3 and Comparative Example 4

The drain current $I_d$ (A) of each of the organic thin-film transistors 200 of Example 3 and Comparative Example 4 were measured with voltage between the source and drain electrodes 24 and 25 in each organic thin-film transistor being 25 V and with voltage between the source electrode 24 and the substrate 21 in each organic thin-film transistor varying from 0 V to 25 V.

Figure 8:
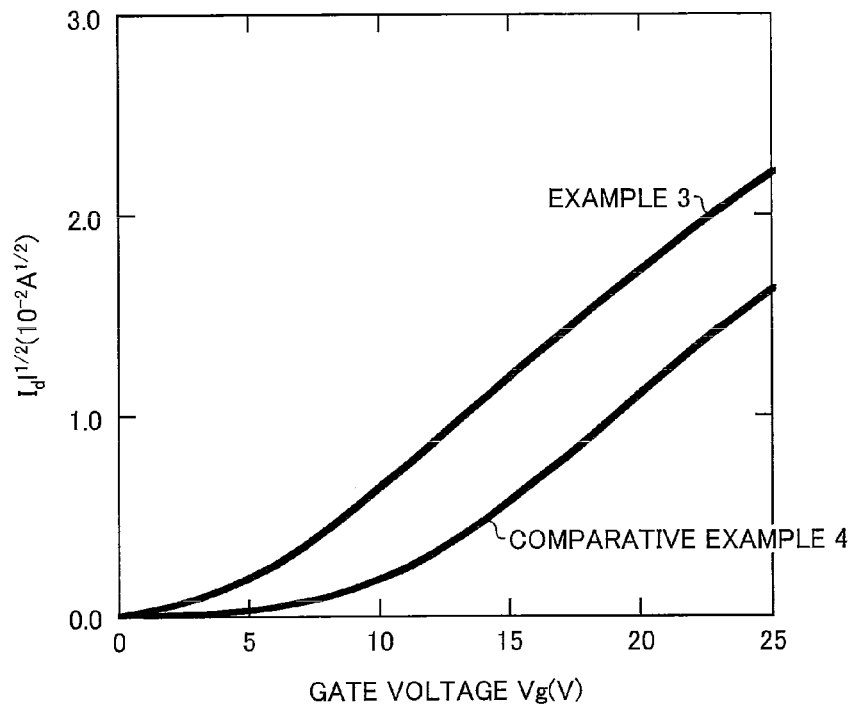
FIG. 8 is a graph showing correlations between drain voltage $I_d$ and gate voltage $V_g$ of organic thin-film transistors of Example 3 and Comparative Example 4 of the present invention.

FIG. 8 is a graph showing correlations between drain voltage $I_d$ (A) and gate voltage $V_g$ (V) of the organic thin-film transistors of Example 3 and Comparative Example 4. In the graph, the horizontal axis represents gate voltage $V_g$ (V), and the vertical axis represents products obtained by multiplying square roots of the drain current $I_d$ by $10^{-2}$.

The threshold voltage $V_T$ of each of the organic thin-film transistors of Example 3 and Comparative Example 4 was recorded by extending the linear portions of the square-root characteristics of $I_d$ in the graph beyond the horizontal axis and reading the voltage values at which the linear portions intersected with the horizontal axis.

As shown in FIG. 8, as compared with the characteristic of Comparative Example 4, in which neither a thiol compound layer 28 nor 29 was formed, the characteristic the organic thin-film transistor 200 of Example 3, in which the thiol compound layers 28 and 29 composed of 4-dimethylaminobenzenethiol were between the source electrode 24 and the organic semiconductor layer 27 and between the drain electrode 25 and the organic semiconductor layer 27, respectively, showed a leftward (negative) shift. Whereas the threshold voltage ($V_T$) of Comparative Example 4 was 10.0 V, the threshold voltage ($V_T$) of Example 3 was 4.1 V.

Thus, it was confirmed that the threshold voltage can be controlled by providing the thiol compound layers 28 and 29 between the source electrode 24 and the organic semiconductor layer 27 and between the drain electrode 25 and the organic semiconductor layer 27, respectively.

Example 4

Figure 9:
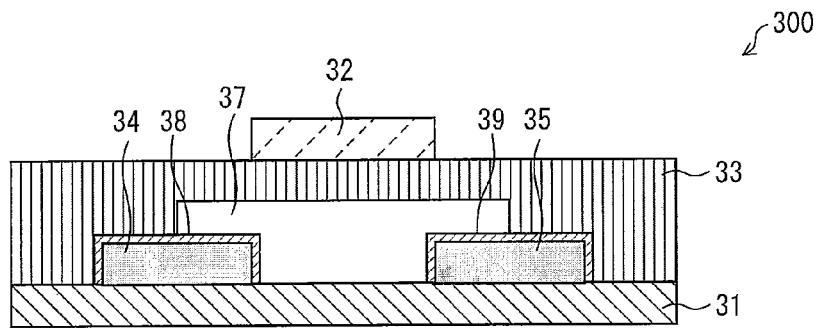
FIG. 9 is a cross-sectional view of a relevant part of an organic thin-film transistor according to Example 4 of the present invention.

An organic thin-film transistor of Example 4 has a top-gate structure to which control of threshold voltage by thiol compound layers has been applied. FIG. 9 is a cross-sectional view of a relevant part of an organic thin-film transistor produced in Example 4.

The following describes manufacturing steps of a method for manufacturing the organic thin-film transistor of Example 4.

First, on a substrate 31 composed of glass, a source electrode 34 and a drain electrode 35 each composed of gold (Au) were produced by means of a liftoff method as in Example 1.

Then, a thiol compound layer 38 and a thiol compound layer 39 were formed on surfaces of the source and drain electrodes 34 and 35, respectively, by using 4-methylbenzenethiol as a benzenethiol compound and by using an acetonitrile solution as in Example 1.

Next, an organic semiconductor layer 37 having a film thickness of 100 nm was formed by depositing fullerene $C_{60}$ through a mask (not shown).

Furthermore, an insulating film composed of parylene with a film thickness of 500 nm was formed on the substrate 31 by means of a CVD method in such a way as to cover the source electrode 34, the drain electrode 35, and the organic semiconductor layer 37. The insulating film served as a gate insulating film 33.

Finally, an Al—Si alloy film having a film thickness of 40 nm was formed by sputtering through a mask in such a way as to overlap a channel region of the organic semiconductor layer 37, the channel region being interposed between the source electrode 34 and the drain electrode 35, whereby a gate electrode 32 was produced.

Through the process described above, the organic thin-film transistor 300 of Example 4 shown in FIG. 9 was produced.

Comparative Example 5

An organic thin-film transistor of Comparative Example 5 was produced in the same manner as in Example 4, except that neither a thiol compound layer 38 nor 39 for controlling the threshold voltage was formed on the source or drain electrode 34 or 35 in an organic thin-film transistor of Example 4.

Comparison Between Example 4 and Comparative Example 5

The threshold voltage of the organic thin-film transistor of Example 4 and the threshold voltage of the organic thin-film transistor of Comparative Example 5 were measured and compared in the same manner as mentioned above. In the result, the threshold voltage ($V_T$) of Example 4 was 10 V, whereas the threshold voltage ($V_T$) of Comparative Example 5 was 25 V.

Thus, it was confirmed that the threshold voltage can be controlled by the thiol compound layers 38 and 39 also in such a top-gate structure as in Example 4.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

An organic thin-film transistor of the present invention can be suitably applied various electronic components because its threshold voltage can be independently controlled without greatly affecting a current characteristic other than the threshold voltage. For example, it can be suitably used in the field of flexible displays.

REFERENCE SIGNS LIST

| | |
|---|---|
| 100, 100a, 200, 300 | Organic thin-film transistor |
| 1, 10, 21, 31 | Substrate |
| 2, 22, 32 | Gate electrode |
| 3, 23, 33 | Gate insulating film |
| 4, 24, 34 | Source electrode |
| 5, 25, 35 | Drain electrode |
| 6, 26 | Silane compound layer |
| 7, 27, 37 | Organic semiconductor layer |
| 8, 28, 38 | Thiol compound layer |
| 9, 29, 39 | Thiol compound layer |

The invention claimed is:

1. An organic thin-film transistor having a gate electrode, a gate insulating film, a source electrode, a drain electrode, an organic semiconductor layer composed of fullerene or a derivative thereof provided above a substrate, and a silane compound layer composed of a silane compound provided in such a portion on a surface of the gate insulating film as to make contact with the organic semiconductor layer,
wherein the organic thin-film transistor comprising thiol compound layers are provided in such portions on the source and drain electrodes, respectively, as to make electrical contact with the organic semiconductor layer, the thiol compound layers being respectively composed of 4-aminobenzenethiol, 4-methylbenzenethiol, or 4-dimethylaminobenzenethiol.

2. The organic thin-film transistor as set forth in claim 1, wherein the benzenethiol compounds have thiol groups having chemical bonds to materials constituting the source and drain electrodes, the thiol groups being on surfaces of the source and drain electrodes, respectively.

3. The organic thin-film transistor as set forth in claim 1, wherein the source electrode and the drain electrode are respectively composed of materials each selected from the group consisting of gold (Au), silver (Ag), copper (Cu), platinum (Pt), palladium (Pd), and an alloy containing at least one of these.

4. The organic thin-film transistor as set forth in claim 1, wherein the benzenethiol compound constituting the thiol compound layer provided on the source electrode and the benzenethiol compound constituting the thiol compound layer provided on the drain electrode are identical.

5. The organic thin-film transistor as set forth in claim 1, wherein the source electrode and the drain electrode are made of identical materials.

6. The organic thin-film transistor as set forth in claim 2, wherein:
the source electrode and the drain electrode are made of metal materials, respectively; and
the chemical bonds are ones generated by thiol-metal reactions between the thiol groups of the benzenethiol compounds and the metal materials constituting the source electrode and drain electrodes, respectively.

7. The organic thin-film transistor as set forth in claim 2, wherein each of the chemical bonds is a covalent bond, an ionic bond, or a coordinate bond.

8. The organic thin-film transistor as set forth in claim 1, wherein the silane compound is a disilazane derivative or alkylsilane.

9. A method for manufacturing an organic thin-film transistor having a gate electrode, a gate insulating film, a source electrode, a drain electrode, and an organic semiconductor layer composed of fullerene or a derivative thereof provided above a substrate, said organic thin-film transistor being provided with a silane compound layer composed of a silane compound in such a portion of a surface of the gate insulating film as to make contact with the organic semiconductor layer, said method comprising a step of:

forming thiol compound layers in such portions on the source and drain electrodes, respectively, that the thiol compound layers make electrical contact with the organic semiconductor layer, the thiol compound layers being respectively composed of 4-aminobenzenethiol, 4-methylbenzenethiol, or 4-dimethylaminobenzenethiol.

* * * * *